(12) United States Patent
Thuries et al.

(10) Patent No.: US 10,418,972 B2
(45) Date of Patent: Sep. 17, 2019

(54) PHASE SHIFTER

(71) Applicant: NXP B.V., Eindhoven (NL)

(72) Inventors: Stephane Thuries, Saubens (FR); Cristian Pavao Moreira, Frouzins (FR); Gilles Montoriol, Plaisance du Touch (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/974,035

(22) Filed: May 8, 2018

(65) Prior Publication Data

US 2019/0013797 A1 Jan. 10, 2019

(30) Foreign Application Priority Data

Jul. 6, 2017 (EP) .................... 17305874

(51) Int. Cl.
| | | |
|---|---|---|
| *H04L 5/12* | (2006.01) | |
| *H04L 23/02* | (2006.01) | |
| *H03H 11/16* | (2006.01) | |
| *H03F 3/24* | (2006.01) | |
| *H03M 1/66* | (2006.01) | |
| *H04L 27/00* | (2006.01) | |
| *H04L 27/20* | (2006.01) | |
| *H04L 27/36* | (2006.01) | |
| *G01S 7/40* | (2006.01) | |
| *G01S 13/34* | (2006.01) | |

(52) U.S. Cl.
CPC ............. *H03H 11/16* (2013.01); *H03F 3/24* (2013.01); *H03M 1/66* (2013.01); *H04L 27/0008* (2013.01); *H04L 27/206* (2013.01); *H04L 27/362* (2013.01); *G01S 7/4056* (2013.01); *G01S 13/34* (2013.01)

(58) Field of Classification Search
CPC ..... H03H 11/16; H04L 27/362; H04L 27/206; H04L 17/0008; H04L 27/008; H03M 1/66; H03F 3/24; H04B 1/1027; G01S 7/4056; G01S 13/34
USPC ........ 375/261, 298, 219, 220, 222, 195, 316
See application file for complete search history.

(56) References Cited

U.S. PATENT DOCUMENTS

| | | |
|---|---|---|
| 7,545,856 B2 | 6/2009 | Behzad et al. |
| 8,737,531 B2 | 5/2014 | Saunders |
| 2009/0219193 A1 | 9/2009 | Szajnowski et al. |
| 2014/0266345 A1 | 9/2014 | Matsumura |
| 2016/0109559 A1 | 4/2016 | Delbecq et al. |
| 2017/0187405 A1* | 6/2017 | Sen ................ H04B 1/1027 |

* cited by examiner

*Primary Examiner* — Phuong Phu (57) ABSTRACT

The disclosure relates to a phase shifter having a first mode of operation and a second mode of operation, the phase shifter comprising a mixer stage configured to mix an oscillator signal with an analog signal to provide a phase shifted signal, switching circuitry and a controller arranged to provide the analog signal to the mixer stage as a voltage in the first mode of operation and as a current in the second mode of operation.

48 Claims, 8 Drawing Sheets

PHASE SHIFTER

CROSS-REFERENCE TO RELATED APPLICATIONS

This application claims the priority under 35 U.S.C. § 119 of European Patent application no. 17305874.4, filed on 6 Jul. 2017, the contents of which are incorporated by reference herein.

The present disclosure relates to a phase shifter. In particular, although not exclusively, the disclosure relates to a radio detection and ranging (radar) device with a transmitter comprising a phase shifter.

Phase rotators or Phase Shifter circuits are often used in communication systems, and more specifically in transceivers. Particularly in radar systems, a phase shifter may be placed in the transmitter path, allowing beam forming, which increases radar resolution.

According to a first aspect of the present disclosure there is provided a phase shifter comprising:
  a mixer stage configured to mix an oscillator signal with an analogue signal to provide a phase shifted signal,
  switching circuitry and a controller arranged to provide the analogue signal to the mixer stage as a voltage in a first mode of operation and as a current in a second mode of operation.

The invention proposes a flexible phase shifter circuitry and apparatus operating in voltage or current modes, allowing to trade-off phase accuracy and transmitted noise. Operating in voltage mode, the PS system allows phase shifting accuracy to be increased, while in current mode the PS may have a lower accuracy but considerably reduced transmitted noise power. In this way, a flexible and reconfigurable phase shifter (PS) apparatus is provided which can be operated in two voltage or current modes depending on the selected application. The provision of the switching circuitry enables the same mixer to be used in both modes, thereby reducing component duplication.

The analogue signal may be provided in accordance with a desired phase shift.

The mixer stage may comprise a mixer and a transconductance stage. The controller may be configured to control the switching circuity to provide the analogue signal to the transconductance stage in the first mode of operation. The controller may be configured to control the switching circuity to connect the transconductance stage to the mixer in the first mode of operation. The controller may be configured to provide the analogue signal to the mixer in the second mode of operation. The controller may be configured to control the switching circuity to isolate the transconductance stage from the mixer or analogue signal in the second mode of operation.

The phase shifter may comprise an in-phase mixer and a quadrature mixer for mixing an oscillator signal with respective in-phase and quadrature analogue signals to provide phase shifted signals in accordance with the desired in-phase and quadrature-phase shifts.

According to a further aspect of the present disclosure there is provided a transmitter module comprising:
  a digital-to-analogue converter configured to receive a control signal indicative of a desired phase shift and to provide the analogue signal in accordance with the desired phase shift; and
  the phase shifter of any preceding claim.

The transmitter may comprise a selectable load. The switching circuitry and controller may be configured to engage the selectable load with an output of the digital-to-analogue converter in the first mode of operation to provide a voltage, optionally based on the current at the output of the digital-to-analogue converter. The switching circuitry and controller may be configured to isolate the selectable load from the output of the digital-to-analogue converter in the second mode of operation.

A current may be provided at the output of the digital-to-analogue converter.

The transmitter module may comprise a low pass filter. The switching circuitry and controller may be configured to engage the low pass filter with an output of the digital-to-analogue converter in the first mode of operation. The switching circuitry and controller may be configured to isolate the low pass filter from the output of the digital-to-analogue converter in the second mode of operation.

The transmitter module may comprise a direct digital synthesiser configured to provide the control signal to the digital-to-analogue converter. The transmitter module may comprise a sigma delta modulator. The switching circuity and controller may be further configured to engage the sigma-delta modulator between the direct digital synthesiser and the digital-to-analogue converter in the first mode of operation. The switching circuity and controller may be further configured to provide the control signal directly or indirectly from the direct digital synthesiser to the digital-to-analogue converter in the second mode of operation. The switching circuity and controller may be further configured to isolate the sigma-delta modulator from the direct digital synthesiser or the digital-to-analogue converter in the second mode of operation.

The digital to analogue converter may comprise an in-phase digital-to-analogue converter configured to receive a control signal indicative of a desired in-phase shift and to provide an in-phase analogue signal in accordance with the desired in-phase shift. The digital to analogue converter may comprise a quadrature-phase digital-to-analogue converter configured to receive a control signal indicative of a desired quadrature-phase shift and to provide a quadrature-phase analogue signal in accordance with the desired quadrature-phase shift. The digital-to-analogue converter may have 7 or fewer bits.

According to a further aspect of the present disclosure there is provided a transceiver having a normal mode of transmitter operation and a self-test mode of operation, comprising:
  the phase shifter described above; and
  a controller configured to drive the phase shifter:
    in a current mode during the normal mode of transmitter operation; and
    in a voltage mode during the self-test mode of operation.

The phase shifter is able to operate in voltage or current mode, according to the required operating mode, BIST or functional, of the transceiver. This allows an optimization of trade-off between transmitted phase accuracy and transmitted noise power. Good phase accuracy for BIST mode and reduced transmitted noise to decrease noise factor (NF) desensitization in normal mode. At the same time, silicon area is reduced compared to a two phase shifter solution because of the use of the same mixer in both modes.

The transceiver may comprise only a single in-phase phase shifter and a single quadrature phase shifter. The transceiver may be a RADAR transceiver According to a further aspect of the present disclosure there is provided a method of operating a phase shifter having a mixer stage configured to mix an oscillator signal with an analogue signal to provide a phase shifted signal in accordance with a desired phase shift, comprising:

controlling switching circuitry to provide the analogue signal to the mixer stage as a voltage in a first mode of operation; and controlling switching circuitry to provide the analogue signal to the mixer stage as a current in the second mode of operation.

The first mode of operation may be a testing mode for a transceiver. The second mode of operation may be a normal transmission mode for the transceiver.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

In communication systems in which the antenna is shared between a transmitter and a receiver (Radar, FDD systems, etc.), a limited isolation exists between the transmitter (TX) and the receiver (RX). For FDD systems (like WCDMA, LTE), an external high selectivity filter is generally placed between the antenna and the transceiver in order to mitigate the limited isolation. In Radar systems, it may be that no filter is placed between the antenna and the transceiver, and the TX noise power can couple to the RX input due to the limited TX-to-RX isolation and then increase the intrinsic receiver noise figure (NF), which may be referred to as NF desensitization. This degrades the full system sensitivity. In order to relax the NF dependence on limited isolation (at the silicon level or board level), the transmitter output noise power (the sum of the phase noise and amplitude noise coming from all TX blocs) must be kept below a given level. When placed in a transmitter chain, the phase shifter (PS) or phase rotator is often the main noise contributor, due mainly to circuit architecture.

Figure 1:
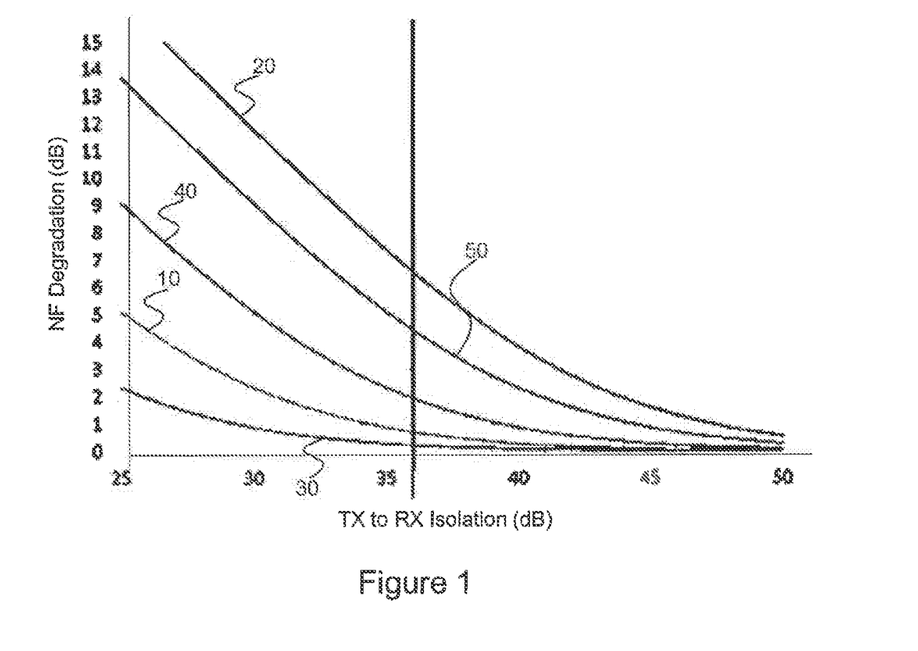
FIG. 1 shows a profile of noise figure (NF) against transmitter-receiver isolation for a RADAR system.

FIG. 1 shows examples of the different transmitter total noise on RX NF for a radar application. For a transceiver with RX_NF=13 dB, a TX_PA output power of 12 dBm, and considering a TX to RX isolation of 36 dB, if the TX total noise PN (mainly dominated by the phase shifter) stay below −145 dBc/Hz (first profile 10), the RX_NF will be degraded by less than 1 dB, ie, goes up to 14 dB. However, for a TX total noise of −132 dBc/Hz (second profile 20), and same conditions (isolation, NF, PA_Pout), the RX NF will be directly degraded by 6.5 dB, i.e., goes up to 19.5 dB, which is well above an example RADAR RX specification of 15 dB. FIG. 1 also includes a third profile 30 having a transmitter phase noise of −150 dBc/Hz, a fourth profile having a transmitter phase noise of −140 dBc/Hz and a fifth profile having transmitter phase noise of −135 dBc/Hz.

A phase shifter (PS) may be implemented in voltage mode to be used in a built-in self-test (BIST) operating mode because this kind of circuit configuration provides an output voltage signal with a good signal-to-noise ratio (SNR) while keeping a reasonable circuit size. In such examples, a sigma delta modulator DAC with a reasonable number of bits and a simple low pass filter can be combined to drive the core of a phase shifter circuit and provide a clean voltage signal for self-testing purpose. However, a potential disadvantage of implementing a voltage driven phase shifter is that it may have a relatively high transmitted output noise, due to its principle of operation, transposing amplitude noise in-phase noise.

Current mode PS could be used to circumvent this limitation, because no additional transformation from Voltage to Current (gm) is required. However, in order to obtain good phase accuracy, which is typically required for built-in self-testing (BIST), a current mode PS would require a very high order (number of hits), because no sigma delta+filtering can be used in current mode. This would result in a substantial increase in silicon area being required.

Figure 2:
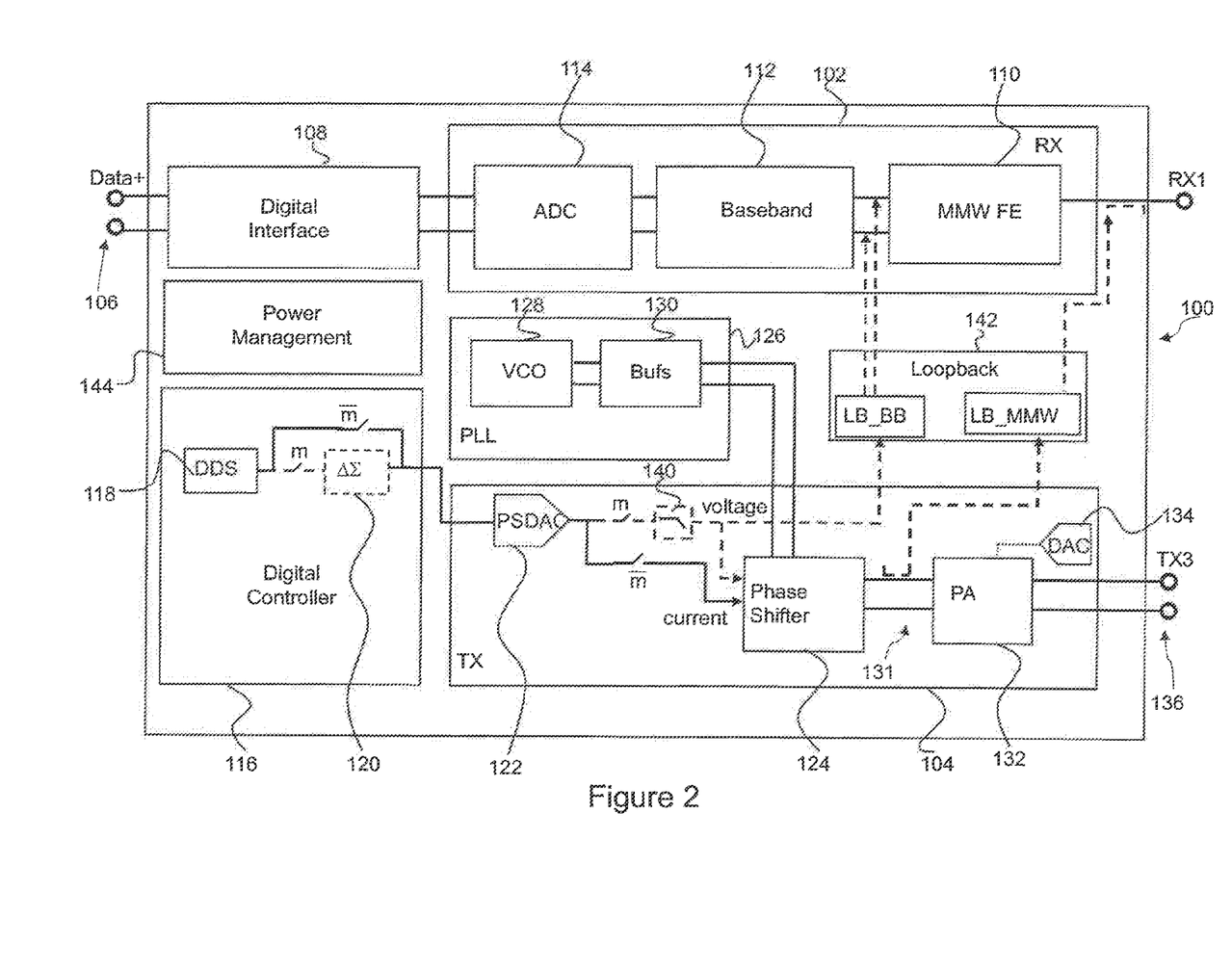
FIG. 2 shows a simplified block diagram of a RADAR device.

FIG. 2 illustrates a simplified block diagram of a radar device 100. The radar device 100 comprises a radar transceiver with a receiver module 102 and a transmitter module 104. A data output 106 can be retrieved from the receiver module 102 via a digital interface 108. The receiver module 102 may comprise, for example, a millimeter wave front end (MMW FE) 110 coupled to a receiver input and configured to provide a signal to a baseband 112, composed of variable gain amplifiers and filters. Signals passed by the baseband 112 may be converted from the analogue-to-digital domain by an analogue-to-digital convertor 114 in order to provide a digital output of the receiver module 102. The digital output of the receiver module 102 may be exported from the radar device 100 via a digital interface. The digital interface 108 may comprises buffers and data format convertors, for example.

The transmitter 104 is connected to a digital controller 116. The digital controller 116 comprises a direct digital synthesiser (DDS) 118. The output of the DDS 118 is provided by the digital controller 116 to the transmitter module 104. The signal from the DDS 118 may be provided at the output of the digital controller 116 via a sigma-delta modulator 120.

The phase of the signal for transmission is generated by a phase shifter digital-to-analogue convertor 122 of the transmitter module 104 under the control of the DDS 118 of the digital controller 116. The phase shifted DAC 122 drives a phase shifter 124. The phase shifter 124 also receives an oscillator signal from a phase lock loop (PLL) circuit 126. The phase lock loop circuit 126 comprises a voltage controlled oscillator 128 and buffers 130. The phase shifter 124 provides a phase shifted signal 131 to a power amplifier (PA) 132. The PA 132 also received the output of a digital-to-analogue convertor (DAC) 134. The DAC 134 provides the control of output power of the PA 132 in current mode. The PA 132 provides a transmission signal 136 for providing to the transmitter.

The transmitter module 104 and digital controller 116 are operable in either a voltage mode or a current mode, in this embodiment. The mode of the transmitter module 104 may be controlled in accordance with a state of the radar device 100 via the digital controller 116. For example, in a normal mode of operation, the transmitter module 104 may operate in current mode. In a built-in self-test mode of operation, the transmitter module may be driven in voltage mode. It has been found that the voltage mode of operation of the phase shifter 124 of the transmitter module 104 provides higher accuracy than the current mode, which is useful for testing the linearity of the receiver chain during a built-in self-test (BIST) procedure. Whereas, by driving the phase shifter 124 in a current mode during the normal mode of operation, the transmitter power noise of the transmitter module 104 in normal operation may be reduced compared to the use of voltage mode driven phase shifters.

In the voltage mode of operation, the output of the DDS 118 may be provided to the input of the phase shifter DAC via the sigma-delta modulator 120. The output of the phase shifter DAC 122 in the voltage mode is provided to the phase shifter 124 via a lower pass filter 140 to remove out-of-band signals. The use of a sigma-delta (SD) modulator to drive the PS DAC 122 may increase the phase accuracy of the transmitted signals by increasing the effective number of bits of the PS DAC 122. In this way, the complexity of the PS DAC that is required can be reduced while still providing acceptable performance. This is possible thanks to the dithering mechanism intrinsic to a SD modulator. A delta-sigma DAC encodes a high-resolution digital input signal into a lower-resolution but higher sample-frequency signal that is mapped to voltages, and then smoothed with an analogue filter. The temporary use of a lower-resolution signal simplifies circuit design and improves efficiency. Otherwise, a PSDAC with limited number of bits may not be enough to generate a clean test signal. For example, a simple 7 bit DAC would create an output sinus test signal with poor SNR (theoretically 46 dB), and this distortion may not allow to properly characterize the RX linearity though loopback path.

The output of the lower pass filter in the voltage mode is also provided by a loop back module 142 to the input of the baseband 112 of the receiver module 102 as part of the built-in self-test (BIST) procedure. In voltage mode, the output of the phase shifter 124 is also provided at the input of the millimeter wave front end 110 of the receiver module 102 via the loop back module 142.

During the normal mode of operation, when the phase shifter is current driven, the output of the DDS 118 is provided directly to the input of the phase shifter DAC 122, and the output of the phase shifter DAC 122 is provided directly as an input to the phase shifter 124. The loop back module 142 for use in the built-in self-test (BIST) procedure and so is not required in the current mode of operation.

In this way, according to the selected mode (voltage or current), parts of the circuit are activated or deactivated to provide the best trade-off between signal phase accuracy and transmitted noise power. The ability to drive the phase shifter in either voltage or current mode is combined within a single phase shifter architecture in order to provide both a good signal (high SNR) for testing purpose and a low transmitter noise power during normal transmitter operation.

The radar device 100 also comprises a power management module 144, which may operate in a conventional fashion. The radar device 100, or part thereof, may be implemented using CMOS technology.

Figure 3A:
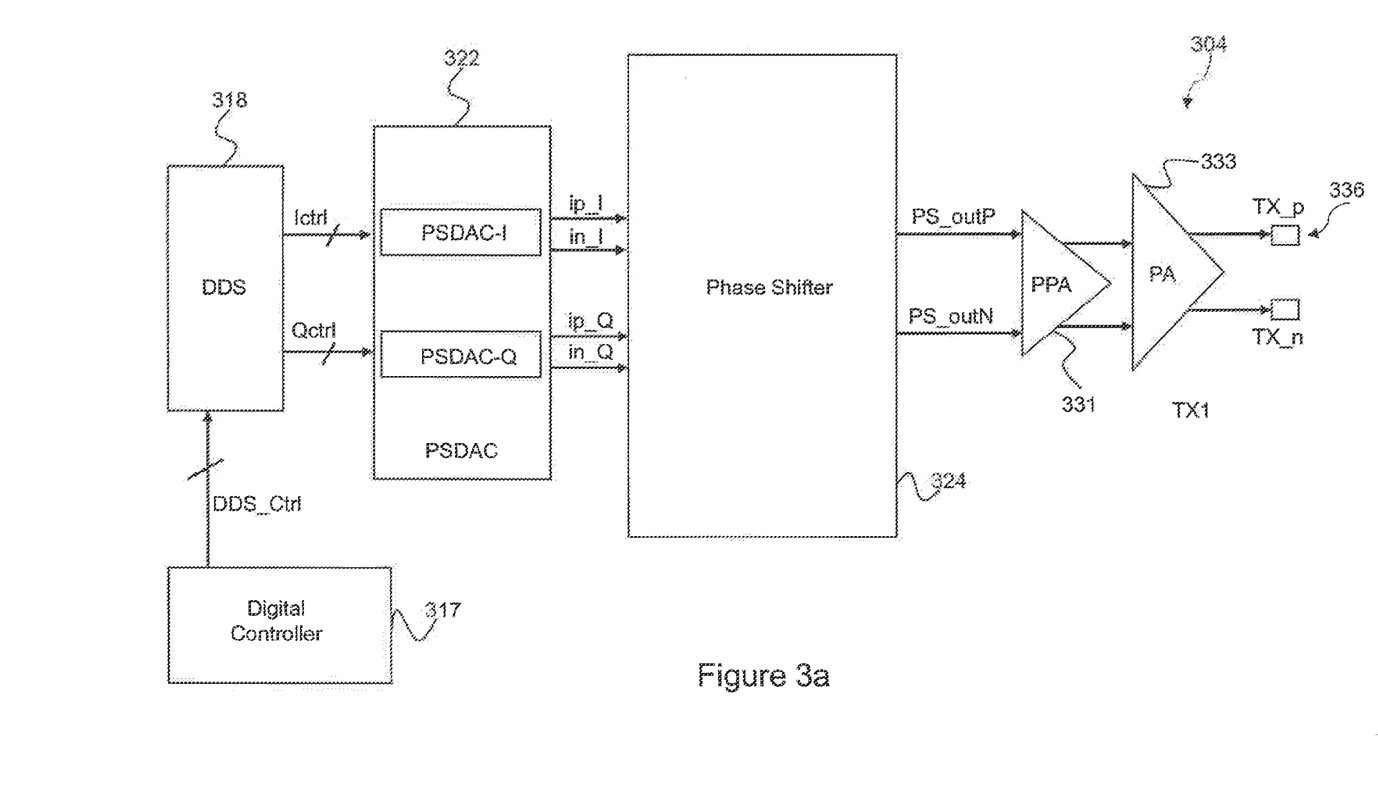
FIG. 3a shows a simplified block diagram of a transmitter module.

FIG. 3a illustrates a schematic block diagram for a transmitter module 304. In this example, the transmitter module 304 is integrated with a digital controller 317 and a DDS 318.

In this example, it is clarified that the transmitter module 304 has separate in-phase and quadrature paths, which are processed in parallel. The in-phase and quadrature signal paths each comprise a series arrangement of the DOS 318, phase shifter DAC 322, phase shifter 324, a pre-power amplifier 331 and a power amplifier 333. The power amplifier 333 provides an output signal 336 for the transmitter module 304.

The digital controller 317 provides a control signal DDS_Ctrl to the DOS 318. The DDS 318 provides an in-phase control signal and I_Ctrl a quadrature control signal Q_Ctrl to respective in-phase and quadrature DACs within the PS DAC 322. Each of the in-phase and quadrature DACs of the PS DAC 322 provide one or more analogue signals ip_I, in_I, ip_Q, in_Q to the phase shifter 324. In this example, the one or more analogue signals ip_I, in_I, ip_Q, in_Q are balanced signals. The phase shifter 324 provides one or more phase shifter output signals PS_outP, PS_outN, which can be amplified by the pre-power amplifier 331 and the power amplifier 333 to provide the transmitter output 336. In this way, the digital controller 317 enables a static output phase or a given IF frequency (dynamic operation) at PS DAC outputs PS_outp, Ps_outn.

Figure 3B:
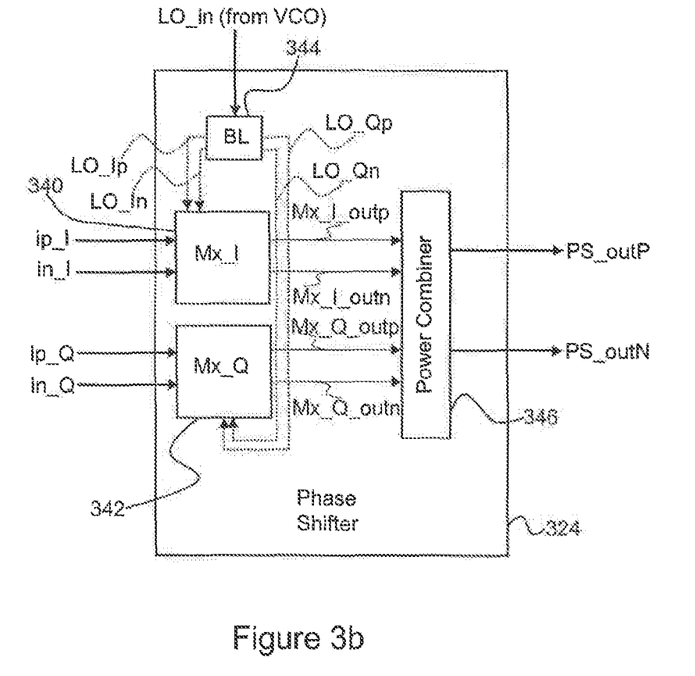
FIG. 3b shows a simplified block diagram of a phase shifter.

FIG. 3b illustrates a schematic block diagram of the in-phase and quadrature processing performed in the phase shifter 324. The phase shifter 324 comprises an in-phase mixer 340, a quadrature mixer 342, a branch line coupler 344 and a power combiner 346.

The branch line coupler 344 converts an unbalanced local oscillator input signal LO_in into balanced local oscillator signals LO_Ip, LO_In for the in-phase mixer 340 and balanced local oscillator signals LO_Qp, LO_Qn for the quadrature mixer 342. The in-phase mixer 340 mixes the balanced local oscillator signal LO_Ip, LO_In with the balanced in-phase analogue signals ip_I, in_I to provide in-phase mixer output signals Mx_I_outp, Mx_I_outn to the power combiner 346. The quadrature mixer 342 mixes the balanced local oscillator signals LO_Qp, LO_Qn with the quadrature phase analogue signal ip_Q, in_Q to provide mixer output signals Mx_Q_outp, Mx_Q_outn to the power combiner 346. The power combiner 346 combines the in-phase and quadrature mixer output signals Mx_I_outp, Mx_I_outn, Mx_Q_outp, Mx_Q_outn to provide phase shifter output signals PX_outP, PS_outN. In this example, the input and output signals of the power combiner 346 are all balanced signals.

Figure 4:
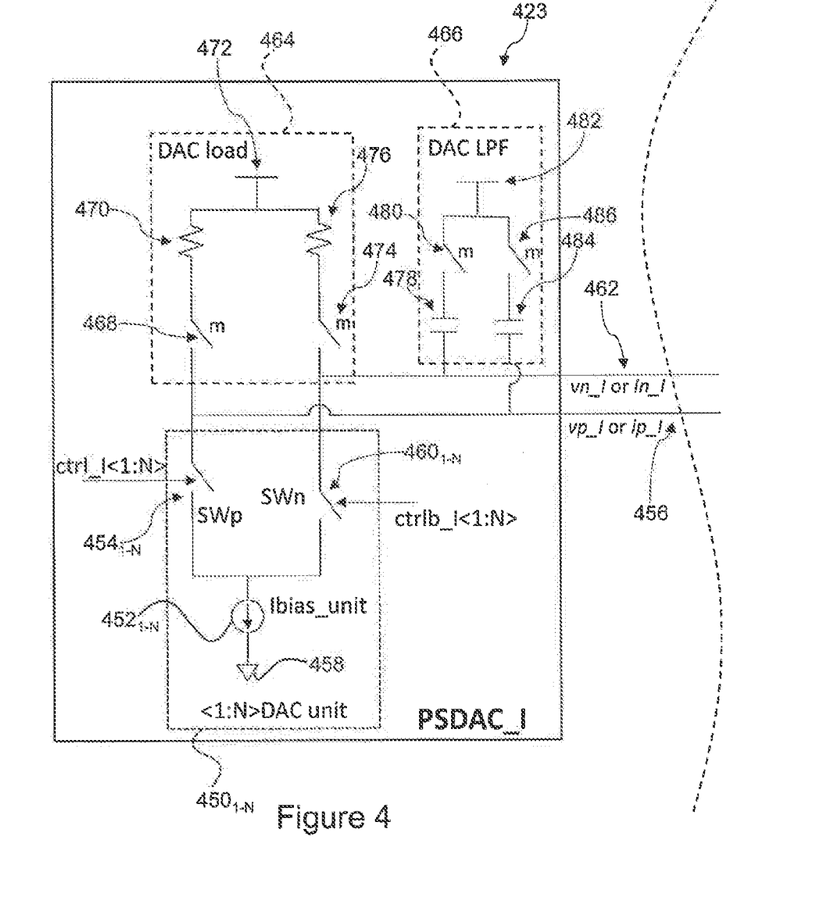
FIG. 4 shows a schematic profile of a phase shifter digital-to-analogue converter and mixer module of a phase shifter.

FIG. 4 shows, for clarity, a schematic block diagram of components of the quadrature path of the PS DAC and PS according to an implementation. In particular, FIG. 4 illustrates a quadrature PS DAC 423 and a quadrature mixer stage 440. Corresponding components may also be provided in an in-phase path.

The quadrature PS DAC comprises a plurality of DAC units, having N units in total. Each DAC unit provides a switched current source. Together, the currents from the plurality of DAC units 450 provide a summed current. Each DAC unit $450_{1-N}$ also comprises a first switch $454_{1-N}$. The first switch $454_{1-N}$ is provided in series with the current source $452_{1-N}$ between a first line 456 and ground 458. The second switch $460_{1-N}$ is provided in series with the current source 452 between a second line 462 and ground 458. The second switch $460_{1-N}$ of a particular DAC unit $450_{1-N}$ is operated in accordance with a control signal ctrlb_I<1:N> that is the inverse of a control signal ctrl_I<1:N> applied to a first switch $454_{1-N}$ of the particular DAC unit $450_{1-N}$. For example, if ctrl_I is 0, ctrlb_I is 1, and vice-versa.

The PS DAC also comprises a load module 464 and a low pass filter (LPF) module 466. The load module 464 contains a first load switch 468 provided in series with a load 470 between the first line 456 and a bias potential 472. The load module 464 also comprises a second load switch 474 and a second load 476 provided in series between the second line 462 and the bias potential 472.

The low pass filter module 466 comprises a first capacitor 484 provided in series with a first filter switch 486 between the first line 456 and the potential bias 482. The low pass filter module 466 comprises a second capacitor 478 in series with a second filter switch 480 between the second line 462 and a potential bias 482.

The low pass filter cut-off frequency may depend on the out-band-attenuation required. The filter order, as well as the cut-off frequency, may be varied. A LPF cut-off value may be selected to not attenuate the intermediate frequency (IF) of interest. For example, the LPF cut-off value may be at least 2×IF. The filter order depends on the requirement to attenuate the out-of-band (>IF) signals, example, the slope of filtering for a particular application.

The first and second load switches 468, 474 and first and second filter switches 480, 486 may be operated synchronously so that they are in the same state. These switches 468, 474, 480, 486 may be closed in a first mode of operation and open in a second mode of operation.

The first and second lines 456, 462 convey balanced signals between the (quadrature) PS in DAC 423 and the (quadrature) mixer stage 440. In the first mode of operation, the current from the PS DAC $450_{1-N}$ is provided to the loads 470, 476 so that a voltage is present on the first and second lines 456, 462. The low pass filter module 466 is engaged in the first mode in order to remove out of band noise from the voltage signal. In the second mode of operation, load module 464 and the low pass filter module 466 are disengaged so that the current form the PS DAC $450_{1-N}$ is provided on the first and second lines 456, 462.

The mixer stage 440 comprises a transconductance stage 500, a mixer 600, a mixer load 602 and controllable switching circuitry 510. The transconductance stage 500 is coupled to a current source 502 to provide bias to the mixer and has a first input 504, a first output 505, second input 506 and a second output 507. The controllable switching circuitry 510 comprises first, second, third, fourth, fifth and sixth switches 512, 514, 516, 518, 520, 522.

The first input 504 of the transconductance stage 500 is switchably coupled to the first line 456 by the first switch 512. The second input 506 of the transconductance stage 500 is switchably coupled to the second line 462 by the second switch 514. The first line 456 is switchably coupled to the output of the transconductance stage 500 by the third switch 516. The second output 507 of the transconductance stage 500 is switchably coupled to the second line 462 by the fourth switch 518. The first input 504 of the transconductance stage 500 is coupled to ground by the fifth switch 520. The second input 506 of the transconductance stage 500 is coupled to ground by the sixth switch 522.

The first and second switches 512, 514 are provided in the first set of switches, and may be operated synchronously with each other. The third, fourth, fifth and sixth switches 516, 518, 520, 522 provide a second set of switches that may be operated synchronously with each other. The first set of switches may be controlled so that they are in the opposite state to the second set of switches. For example, when the first set of switches are open, the second set of switches are closed and vice versa. The first set of switches are closed in the first mode of operation so that the transconductance stage inputs 504, 506 are driven by a voltage provided on the first and second lines 456, 462. The second set of switches is open in the first mode of operation in order to isolate the voltages on the first and second lines 456, 462 from the first and second inputs 504, 506, and to isolate first and second inputs 504, 5 6 of the transconductance stage 500 from ground. The mixer 600 in the first mode of operation is therefore driven by the currents present at the outputs 505, 507 of the transconductance stage 500, which relate to the voltages present at the inputs of the transconductance stage 500.

The first mode may therefore be considered to provide a voltage mode of operation for use in a BIST (built-in self-test) condition of a transceiver, where the PS noise is not of main concern, but the number of bits of PSDAC. In BIST mode, used to characterize the RX linearity, the PSDAC may be driven by a sigma-delta in order to increase its effective number of bits, and thus the linearity (SFDR) of the test signal injected into the RX.

In the second mode of operation, the first and second inputs 504, 506 of the transconductance stage 500 are coupled to ground via the fifth and sixth switches 520, 522 and isolated from the current present on the first and second lines 456, 462 by the open first set of switches. In this way, the transconductance circuit is disabled during the second mode of operation. The current present on the first and second lines 456, 462 is provided at the outputs of the transconductance stage 505, 507 via the third and fourth switches 516, 518 in the second mode of operation.

The second mode of operation may therefore be considered to provide a current mode of operation for use in normal operation condition of a transmitter. A current mode PSDAC drives the PS core in current mode, directly at PS core quad devices, with PS gm stage disabled. This is done in order to avoid increasing the PS total phase noise (no AM to PM conversion, V to I transformation), which can increase transmitted noise power, and degrades RX noise figure (NF desensitization) when the TX is ON, this due to the limited TX to RX isolation.

A controller may be provided to control operation of the first and second sets of switches as discussed above. In particular, the controller may be configured to set the first and second switches so that the first mode of operation occurs during a testing mode and the second mode of operation occurs in a normal mode of transmission when the circuit is provided within a transceiver.

Figure 5:
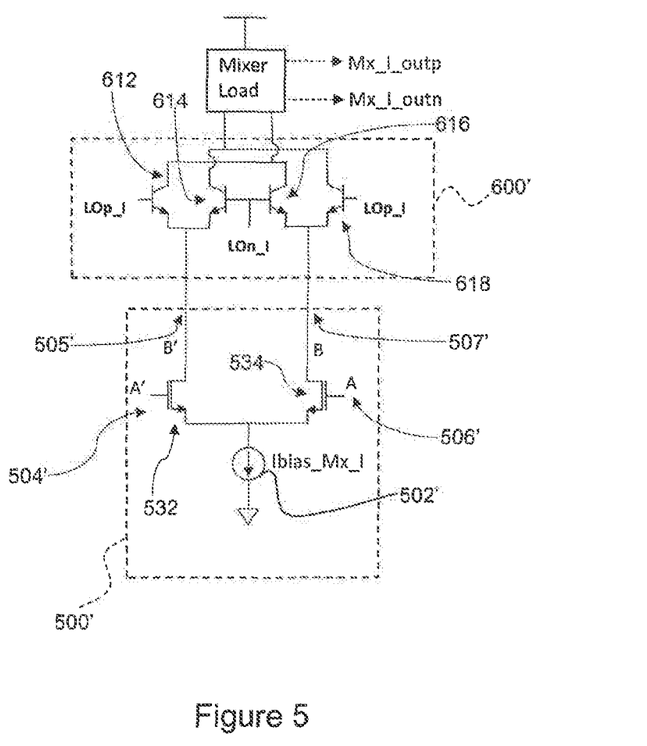
FIG. 5 shows a circuit diagram for implementing components of the mixer module of FIG. 4.

FIG. 5 shows a circuit diagram for implementing components of the mixer module of FIG. 4. The transconductance stage 500' comprises a bias current source 502' in this example. The transconductance stage has a first field effect transistor 532 with a gate at the first input 504' of the transconductance stage 500' and a conduction channel between the first output 505' of the transconductance stage 500' and the bias current source 502'. A second field effect transistor 534 has a gate at the second input 506' of the transconductance stage 500' and a conduction channel between the second output 507' of the transconductance stage 500' and the current source 502'. The bias current source 502' is provided between the sources of the first and second field effect transistors 532, 534 in this example.

The mixer 600' in this example comprises first, second, third and fourth bipolar transistors 612, 614, 616, 618. The bipolar transistors are NPN transistors in this example. The first and second bipolar transistors 612, 614 have a common emitter coupled to the first output 505' of the transconductance stage 500'. The third and fourth bipolar transistors 616, 618 have a common emitter coupled to the second output 507' of the transconductance stage 500'. The collectors of the second and fourth bipolar transistors 614, 618 provide an output of the mixer 600' in the first output of the mixer 600'. The first and third bipolar transistors 612, 616 provide a second output of the mixer 600'. The bases of the second and third bipolar transistors 614, 616 are coupled to receive a first balanced signal input from the local oscillator. The first and fourth bipolar transistors 612, 618 are coupled to receive a second balanced signal input from the local oscillator.

Figure 6A:
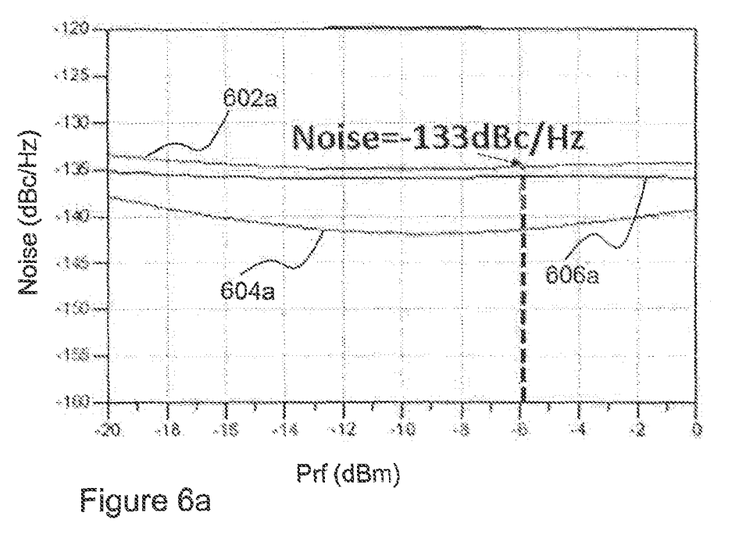
FIG. 6a shows total noise at transmitter output in voltage mode.
Figure 6B:
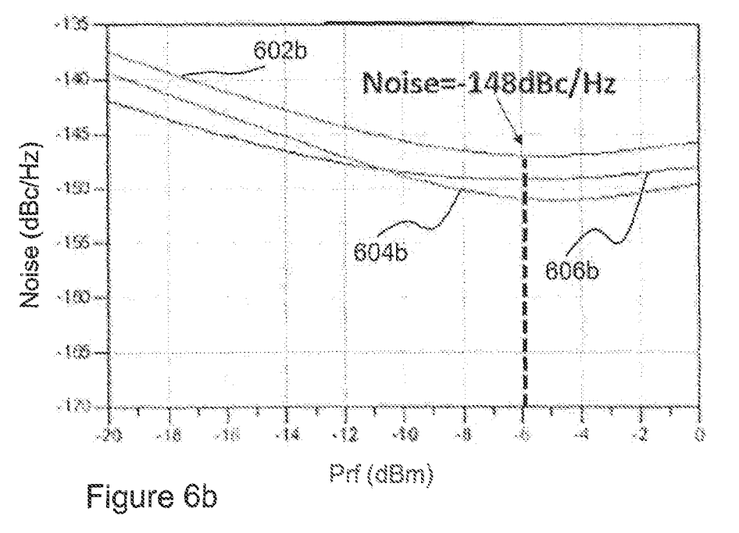
FIG. 6b shows total noise at transmitter output in current mode.

FIGS. 6a and 6b provide a comparison between the noise characteristics of a system comprising the phase shifter digital-to-analogue converter and mixer module of a phase shifter of FIG. 4 operating in voltage mode and current mode.

FIG. 6a illustrates noise profiles in voltage mode PS+PS-DAC (no digital). FIG. 6b illustrates noise profiles in current mode PS+PSDAC (no digital).

In each figure, a total noise profile 602a; 602b illustrates the total noise (phase noise+am noise, in dBc/Hz) as a function of RF power (Prf in dB) at transmitter output. The amplitude noise and phase noise are also illustrated by respective amplitude noise profile 604a; 604b and phase noise 606a; 606b. The total noise is mainly dominated by noise introduced by the Phase Shifter.

As illustrated in FIG. 6a when operating in voltage Mode for BIST BB internal mode, SNR at IF PSDAC output=68 dB for 11 b DAC (7 b+4 b sigma delta modulator). The total Noise is −133 dBc/Hz at RF power of about −6 dBm.

As illustrated in FIG. 6b when operating in current Mode for normal operating mode (Transmit), low TX noise (no Sigma delta modulator). The total noise is −148 dBc/Hz at RF power of about −6 dBm.

That is, there is a degradation of ~15 dB on the output noise when the voltage mode is used, due mainly to the voltage to current transformation provided by the transconductance stage (gm) stage.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A phase shifter comprising:
a mixer stage configured to mix an oscillator signal with an analogue signal to provide a phase shifted signal,
switching circuitry and a controller configured to provide the analogue signal to the mixer stage as a voltage in a first mode of operation and as a current in a second mode of operation;
wherein the mixer stage comprises a mixer and a transconductance stage, wherein the controller is configured to control the switching circuity to:
provide the analogue signal to the transconductance stage and connect the transconductance stage to the mixer in the first mode of operation; and
provide the analogue signal to the mixer in the second mode of operation;
control the switching circuity to isolate the transconductance stage from the mixer or analogue signal in the second mode of operation.

2. The phase shifter of claim 1, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

3. A transmitter module comprising: a phase shifter comprising: a mixer stage configured to mix an oscillator signal with an analogue signal to provide a phase shifted signal, switching circuitry and a controller configured to provide the analogue signal to the mixer stage as a voltage in a first mode of operation and as a current in a second mode of operation, and a digital-to-analogue converter configured to receive a control signal indicative of a desired phase shift and to provide the analogue signal in accordance with the desired phase shift.

4. The transmitter module of claim 3 further comprising a selectable load, wherein the switching circuitry and the controller are configured to:
engage the selectable load with an output of the digital-to-analogue converter in the first mode of operation to provide a voltage, and
isolate the selectable load from the output of the digital-to-analogue converter in the second mode of operation.

5. The transmitter module of claim 3 further comprising a low pass filter, wherein the switching circuitry and the controller are configured to:
engage the low pass filter with an output of the digital-to-analogue converter in the first mode of operation, and
isolate the low pass filter from the output of the digital-to-analogue converter in the second mode of operation.

6. The transmitter module of claim 3, comprising:
a direct digital synthesiser configured to provide the control signal to the digital-to-analogue converter; and
a sigma delta modulator,
wherein the switching circuity and controller are further configured to:
engage the sigma-delta modulator between the direct digital synthesiser and the digital-to-analogue converter in the first mode of operation; and
provide the control signal from the direct digital synthesiser to the digital-to-analogue converter in the second mode of operation.

7. The transmitter module of claim 6, wherein the switching circuity and controller are further configured to isolate the sigma-delta modulator from the direct digital synthesiser or the digital-to-analogue converter in the second mode of operation.

8. The transmitter module of claim 3, wherein the digital to analogue converter comprises:
an in-phase digital-to-analogue converter configured to receive a control signal indicative of a desired in-phase shift and to provide an in-phase analogue signal in accordance with the desired in-phase shift; and
a quadrature-phase digital-to-analogue converter configured to receive a control signal indicative of a desired quadrature-phase shift and to provide a quadrature-phase analogue signal in accordance with the desired quadrature-phase shift.

9. The transmitter module of claim 3, wherein the digital-to-analogue converter has 7 bits.

10. A transceiver having a normal mode of transmitter operation and a self-test mode of operation, comprising:
a phase shifter comprising:
a mixer stage configured to mix an oscillator signal with an analogue signal to provide a phase shifted signal,
switching circuitry and a controller configured to provide the analogue signal to the mixer stage as a voltage in a first mode of operation and as a current in a second mode of operation;
a controller configured to drive the phase shifter:
in a current mode during the normal mode of transmitter operation; and
in a voltage mode during the self-test mode of operation.

11. The transceiver of claim 10 comprising only a single in-phase phase shifter and a single quadrature phase shifter.

12. The transceiver of claim 10, wherein the transceiver is a RADAR transceiver.

13. The transmitter module of claim 4 further comprising a low pass filter, wherein the switching circuitry and the controller are configured to:
engage the low pass filter with an output of the digital-to-analogue converter in the first mode of operation, and
isolate the low pass filter from the output of the digital-to-analogue converter in the second mode of operation.

14. The transmitter module of claim 4, comprising:
a direct digital synthesiser configured to provide the control signal to the digital-to-analogue converter; and
a sigma delta modulator, wherein the switching circuity and controller are further configured to:
engage the sigma-delta modulator between the direct digital synthesiser and the digital-to-analogue converter in the first mode of operation; and
provide the control signal from the direct digital synthesiser to the digital-to-analogue converter in the second mode of operation.

15. A transceiver having a normal mode of transmitter operation and a self-test mode of operation, comprising:
the transmitter module of claim 3; and
a controller configured to drive the phase shifter:
in a current mode during the normal mode of transmitter operation; and
in a voltage mode during the self-test mode of operation.

16. The transmitter module of claim 3, wherein the mixer stage comprises a mixer and a transconductance stage, wherein the controller is configured to control the switching circuity to:
provide the analogue signal to the transconductance stage and connect the transconductance stage to the mixer in the first mode of operation; and
provide the analogue signal to the mixer in the second mode of operation.

17. The transmitter module of claim 16, wherein the controller is configured to control the switching circuity to isolate the transconductance stage from the mixer or analogue signal in the second mode of operation.

18. The transmitter module of claim 3, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

19. The transmitter module of claim 4, wherein the mixer stage comprises a mixer and a transconductance stage, wherein the controller is configured to control the switching circuity to:
provide the analogue signal to the transconductance stage and connect the transconductance stage to the mixer in the first mode of operation; and
provide the analogue signal to the mixer in the second mode of operation.

20. The transmitter module of claim 19, wherein the controller is configured to control the switching circuity to isolate the transconductance stage from the mixer or analogue signal in the second mode of operation.

21. The transmitter module of claim 4, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

22. The transmitter module of claim 5, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

23. The transmitter module of claim 22, wherein the controller is configured to control the switching circuitry to isolate the transconductance stage from the mixer or analogue signal in the second mode of operation.

24. The transmitter module of claim 5, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

25. The transmitter module of claim 6, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

26. The transmitter module of claim 25, wherein the controller is configured to control the switching circuitry to isolate the transconductance stage from the mixer or analogue signal in the second mode of operation.

27. The transmitter module of claim 6, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

28. The transmitter module of claim 7, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

29. The transmitter module of claim 28, wherein the controller is configured to control the switching circuitry to isolate the transconductance stage from the mixer or analogue signal in the second mode of operation.

30. The transmitter module of claim 7, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

31. The transmitter module of claim 8, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

32. The transmitter module of claim 31, wherein the controller is configured to control the switching circuitry to isolate the transconductance stage from the mixer or analogue signal in the second mode of operation.

33. The transmitter module of claim 8, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

34. The transmitter module of claim 9, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

35. The transmitter module of claim 34, wherein the controller is configured to control the switching circuitry to isolate the transconductance stage from the mixer or analogue signal in the second mode of operation.

36. The transmitter module of claim 9, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

37. The transceiver of claim 10, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

38. The transceiver of claim 37, wherein the controller is configured to control the switching circuitry to isolate the transconductance stage from the mixer or analogue signal in the second mode of operation.

39. The transceiver of claim 10, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

40. The transmitter module of claim 13, wherein the mixer stage comprises a mixer and a transconductance stage, wherein the controller is configured to control the switching circuitry to:
provide the analogue signal to the transconductance stage and connect the transconductance stage to the mixer in the first mode of operation; and
provide the analogue signal to the mixer in the second mode of operation.

41. The transmitter module of claim 40, wherein the controller is configured to control the switching circuitry to isolate the transconductance stage from the mixer or analogue signal in the second mode of operation.

42. The transmitter module of claim 13, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

43. The transmitter module of claim 14, wherein the mixer stage comprises a mixer and a transconductance stage, wherein the controller is configured to control the switching circuity to:
provide the analogue signal to the transconductance stage and connect the transconductance stage to the mixer in the first mode of operation; and
provide the analogue signal to the mixer in the second mode of operation.

44. The transmitter module of claim 43, wherein the controller is configured to control the switching circuity to isolate the transconductance stage from the mixer or analogue signal in the second mode of operation.

45. The transmitter module of claim 14, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

46. The transceiver of claim 15, wherein the mixer stage comprises a mixer and a transconductance stage, wherein the controller is configured to control the switching circuity to:
provide the analogue signal to the transconductance stage and connect the transconductance stage to the mixer in the first mode of operation; and
provide the analogue signal to the mixer in the second mode of operation.

47. The transceiver of claim 46, wherein the controller is configured to control the switching circuity to isolate the transconductance stage from the mixer or analogue signal in the second mode of operation.

48. The transceiver of claim 15, wherein the phase shifter comprises an in-phase mixer and a quadrature mixer for mixing an oscillator signal with the respective in-phase and quadrature analogue signals to provide phase shifted signals in accordance with the desired in-phase and quadrature-phase shifts.

* * * * *